(12) United States Patent
Du et al.

(10) Patent No.: US 11,348,951 B2
(45) Date of Patent: May 31, 2022

(54) DISPLAY SUBSTRATE AND MANUFACTURING METHOD THEREOF

(71) Applicants: Hefei Xinsheng Optoelectronics Technology Co., Ltd., Hefei (CN); BOE TECHNOLOGY GROUP CO., LTD., Beijing (CN)

(72) Inventors: Ruifang Du, Beijing (CN); Xiaofang Gu, Beijing (CN); Xiaoye Ma, Beijing (CN); Donghui Zhang, Beijing (CN); Yuxiang Zhang, Beijing (CN)

(73) Assignees: Hefei Xinsheng Optoelectronics Technology Co., Ltd., Hefei (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/830,704

(22) Filed: Mar. 26, 2020

(65) Prior Publication Data
US 2021/0151471 A1    May 20, 2021

(30) Foreign Application Priority Data
Nov. 15, 2019    (CN) .......................... 201911120489.5

(51) Int. Cl.
*H01L 27/12* (2006.01)

(52) U.S. Cl.
CPC ........ *H01L 27/1248* (2013.01); *H01L 27/124* (2013.01); *H01L 27/1259* (2013.01)

(58) Field of Classification Search
None
See application file for complete search history.

(56) References Cited

U.S. PATENT DOCUMENTS

| | | | |
|---|---|---|---|
| 11,092,865 B2 * | 8/2021 | Cheng | H01L 27/1288 |
| 2009/0102824 A1 * | 4/2009 | Tanaka | G09G 3/3648 345/205 |
| 2019/0066617 A1 * | 2/2019 | Zhao | G11C 19/28 |
| 2019/0122626 A1 * | 4/2019 | Du | G09G 3/36 |
| 2019/0386074 A1 * | 12/2019 | Li | H01L 27/3223 |
| 2020/0251066 A1 * | 8/2020 | Hu | G09G 3/3674 |

FOREIGN PATENT DOCUMENTS

| | | | |
|---|---|---|---|
| AU | 2020239614 B2 * | 11/2021 | |
| WO | WO-2021077355 A1 * | 4/2021 | |
| WO | WO-2021203514 A1 * | 10/2021 | |

* cited by examiner

*Primary Examiner* — Bo B Jang
(74) *Attorney, Agent, or Firm* — Thomas | Horstemeyer, LLP

(57) ABSTRACT

A display substrate includes an active area; and a gate-driver-on-array (GOA) circuit area, wherein the active area includes a display pixel area and a dummy pixel area located in the periphery of the display pixel area, and wherein the GOA circuit area includes at least one dummy GOA circuit having an output terminal connected to a pixel electrode of at least one dummy pixel.

16 Claims, 4 Drawing Sheets

DISPLAY SUBSTRATE AND MANUFACTURING METHOD THEREOF

CROSS-REFERENCE TO RELATED APPLICATION

The present application claims the benefit of and priority to Chinese Patent Application No. 201911120489.5 filed Nov. 15, 2019, the entire contents of which are incorporated herein by reference.

TECHNICAL FIELD

The present disclosure relates to display technology and, more particularly, to a display substrate adopting GOA technology and a manufacturing method thereof.

BACKGROUND

Gate-Driver-On-Array (GOA) technology refers to the integration of a gate drive circuit composed of thin film transistors (TFTs) on a glass substrate, and its processes are the same as those of general LCDs. Since the technology has various advantages, such as cost reduction, increase in the yield of modular component processes, and facilitating the implementation of narrow bezels, more and more panels are now being developed by adopting the technology.

SUMMARY

The present invention provides a display substrate including: an active area; and a GOA circuit area, where the active area comprises a display pixel area and a dummy pixel area located in the periphery of the display pixel area, and where the GOA circuit area comprises at least one dummy GOA circuit having an output terminal connected to a pixel electrode of at least one dummy pixel.

In an exemplary embodiment, the pixel electrode of at least one dummy pixel is a floating electrode.

In an exemplary embodiment, when the output terminal of the dummy GOA circuit is connected to pixel electrodes of more than one dummy pixel, the pixel electrodes of adjacent dummy pixels are connected in series through a connection line.

In an exemplary embodiment, when the output terminal of the dummy GOA circuit is connected to pixel electrodes of more than one dummy pixel, the pixel electrodes of the plurality of dummy pixels are connected in series and in parallel through a connection line.

In an exemplary embodiment, the display substrate further comprises a dummy loading area located around the active area, and an electrode line which causes capacitance and resistance to be provided in the dummy loading area, and wherein the electrode line is connected between the output terminal of the dummy GOA circuit and the pixel electrode of the dummy pixel.

In an exemplary embodiment, a common electrode is disposed below the pixel electrode.

In an exemplary embodiment, a common electrode is disposed above the pixel electrode, and a source electrode of a TFT is connected to the pixel electrode through an organic film via hole provided on an organic film.

In an exemplary embodiment, a source electrode of a TFT of a display pixel is connected to a pixel electrode and a source electrode of a TFT of the dummy pixel is disconnected from the pixel electrode.

The present invention further provides a method for manufacturing the display substrate according to any one of the above described embodiments, including: forming a common electrode and a common electrode line on a glass substrate; forming a gate electrode and a gate line on the substrate; coating a gate insulating layer thereon; forming an active layer on the insulating layer; providing a metal source/drain layer; forming a passivation layer on the metal source/drain layer; and forming a pixel electrode on the passivation layer.

In an exemplary embodiment, the method further includes: forming a plurality of pixel electrodes of dummy pixels and connection lines at the same time; and connecting pixel electrodes of adjacent dummy pixels through the connecting lines The present invention further provides a method for manufacturing the display substrate according to any one of the above described embodiments, comprising: forming a gate layer on a glass substrate; forming a gate insulating layer on the gate layer; forming an active layer on the gate insulating layer; providing a source metal source/drain layer; coating an organic film on the metal source/drain layer to form an organic film layer; forming a pixel electrode and a connection line; forming a passivation layer on the pixel electrode and the connection line; and forming a common electrode and a common electrode line on the passivation layer.

In an exemplary embodiment, an organic film via hole is formed on the organic film layer before forming the pixel electrode and the connection line.

BRIEF DESCRIPTION OF THE DRAWINGS

Other features, objectives, and advantages of the present disclosure will become more apparent by reading the detailed description of non-limiting embodiments with reference to the following accompanying drawings.

DETAILED DESCRIPTION

Figure 1:
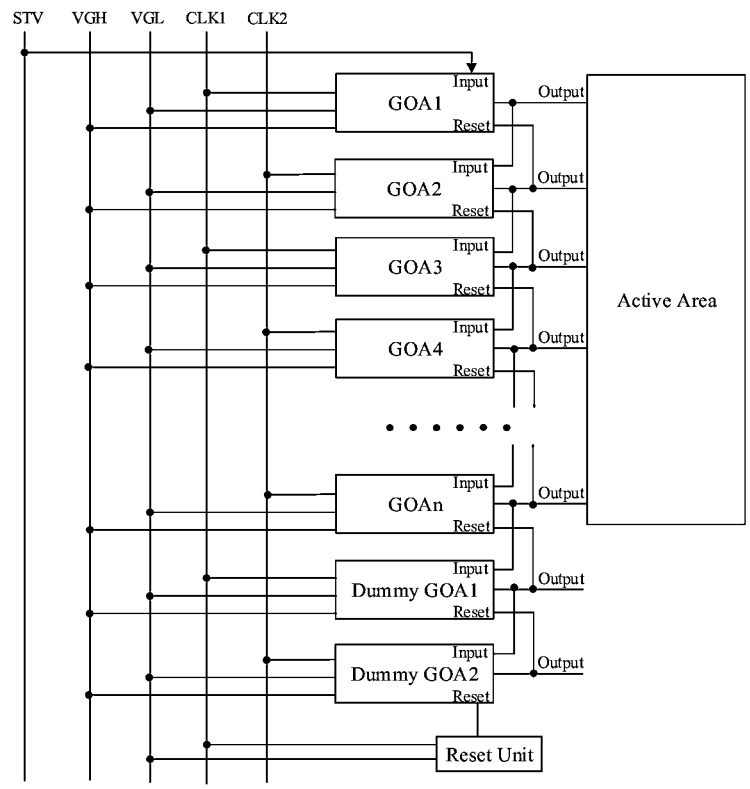
FIG. 1 is a circuit diagram of an existing display screen.

The present disclosure will be described below in more detail in conjunction with the accompanying drawings and embodiments. It can be understood that the specific embodiments described here are only provided to explain relevant invention, rather than limiting the invention. It shall also be noted that only the parts related to the invention are shown in the drawings for convenience of description.

The key to the design of GOA technology lies in a shift register circuit and the reliability of the circuit. Its cascading relationship and sequence diagram are shown in FIGS. 1-3.

Figure 4:
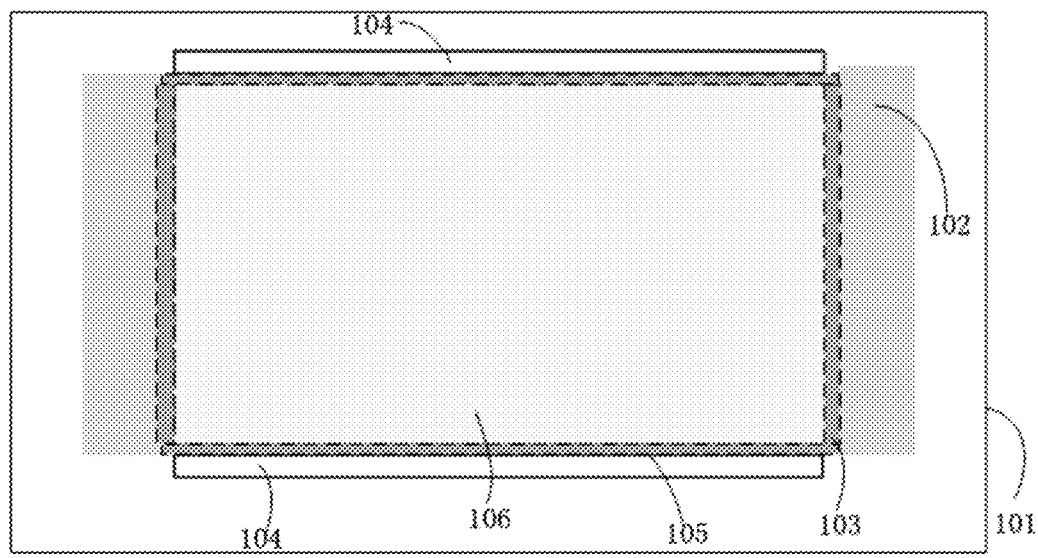
FIG. 4 is a plan view of an existing display screen.
Figure 5:
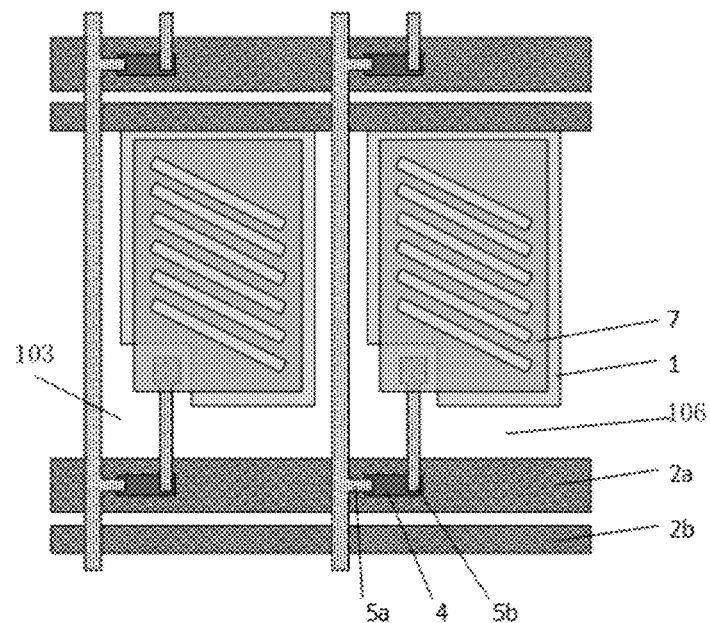
FIG. 5 is a plan view of pixels of an existing display substrate.
Figure 6:
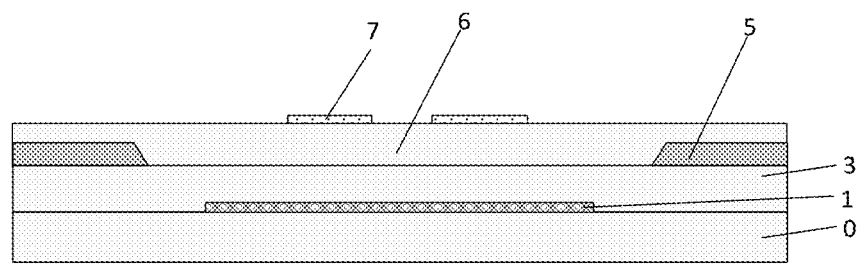
FIG. 6 is a cross-sectional diagram of a pixel area of an existing display substrate.

A view of a conventional display screen, a plan view of pixels, and a cross-sectional diagram of a pixel area are shown in FIGS. 4-6.

It can be seen that an output terminal (Output) of a GOA circuit in one row is a reset terminal (Reset) of a GOA circuit in the previous row and an input terminal (Input) of a GOA circuit in the next row, so their waveforms affect one another. In order to reset a GOA (n) in the last row, a dummy GOA circuit is designed; however, the dummy GOA circuit is not connected to an Active Area (AA), e.g., the dummy GOA circuit is not connected to a load of the AA.

Figure 2:
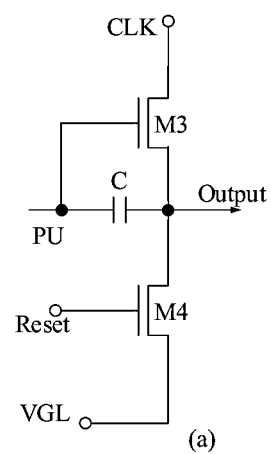
FIG. 2 is a diagram of part of a circuit structure of an existing GOA circuit.
Figure 3:
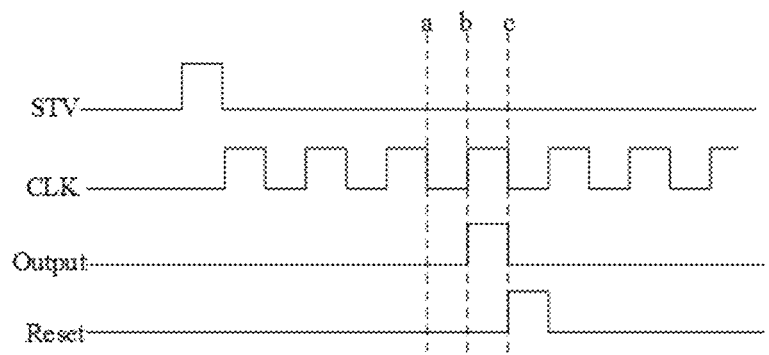
FIG. 3 is a sequence diagram of an existing drive circuit.

As shown in FIGS. 2-3, for the same structural model, a waveform of its output terminal (Output (Gate)) is determined by a waveform of CLK and loading of the output terminal (Output). Since the AA has gate loading, and is normally driven by the GOA circuits in the AA, a waveform of the GOA circuits in the AA is determined by the waveform of CLK and the gate loading. Furthermore, because of the cascading characteristics of GOA, as mentioned earlier, the dummy GOA circuit must be designed to reset the GOA circuits in the AA normally and its corresponding drive loading is dummy loading. Therefore, it is necessary to design the dummy loading for the dummy GOA circuit in order to make a reset signal delay of GOA (n) identical to a reset signal delay of the previous GOA circuits.

In addition, the greater the number of CLKs, the more the dummy GOA circuits will be required (due to the cascading characteristics of the GOA circuits, a subsequent GOA circuit is required to reset the previous one), and their cascade period is related to the number of CLKs. For example, there are pairs of Input and Reset products, and when the number of CLKs is 2n, the period of the GOA circuits is also 2n, and the number of GOA circuits that need to be reset is n at last. The larger n is, the more dummy GOA circuits will be required. As a result, more space is required for the design of the dummy loading (see FIG. 4). However, for narrow bezel products, there is no space to design dummy loading, so a reset delay signal of Output of the dummy GOA circuit (i.e., G (n)) is relatively small, and its waveforms Tr and Tf (which are respectively rising and falling edge time of Gate OUTPUT) are also relatively small, so a Gate signal Delay corresponding to G (n) is smaller than that in other rows, which affects the charging of pixels in this row. In addition, customers of vehicle-borne products generally require GOA which supports bidirectional scanning, so dummy GOA circuits are required to be provided at the start and end of GOA and their corresponding dummy loading requires more space.

It shall be noted that the embodiments in the present disclosure and the features in the embodiments can be combined with one another with no conflict occurring. The present disclosure will be described in detail below with reference to the accompanying drawings and the embodiments.

Referring to the drawings, reference numerals are now described: 0—glass substrate; 1—common electrode; 2a—gate line; 2b—common electrode line; 3—gate insulating layer; 4—active layer; 5a—TFT drain; 5b—TFT source; 6—passivation layer; 7—pixel electrode; 8—connection line; 9—organic film; 9a—organic film via hole; 101—panel boundary; 102—GOA circuit area; 103—dummy pixel area; 104—dummy loading area; 105—active area.

A display substrate of the present invention includes an active area 105 and a GOA circuit area 102. The active area 105 includes a display pixel area 106 and a dummy pixel area 103 located in the periphery of the display pixel area (a certain number of dummy pixels are generally designed in the periphery of the active area in order to make the pixels in the periphery of the active area identical to pixels in the middle of the active area during etching processes and others).

The GOA circuit area 102 includes a plurality of cascaded GOA circuits for driving display pixels in the display pixel area. An output of each GOA circuit is connected to a gate line 2a to drive a row of display pixels.

The GOA circuit area further includes at least one dummy GOA circuit having an output connected to a pixel electrode of at least one dummy pixel. In an exemplary embodiment, the pixel electrode of the dummy pixel and a pixel electrode of its adjacent dummy pixel are connected through a connection line 8 to adjust a resistance value and a capacitance value (loading) of the pixel electrode to which the dummy GOA circuit is connected, so that loading of the dummy GOA circuit is the same as or approximate to loading of the gate line 2a of the GOA circuits.

The solution of the present embodiment is adopted, in which a nonoperative dummy electrode during the use of a display is efficiently used and a resistance value of a dummy pixel electrode and a capacitance value between the dummy pixel electrode and a common electrode are kept substantially the same as a resistance value and a capacitance value of a gate line in each row, thus making loading of GOA circuits the same, so that a signal delay of a dummy GOA circuit is the same as that of other GOA circuits.

Figure 7:
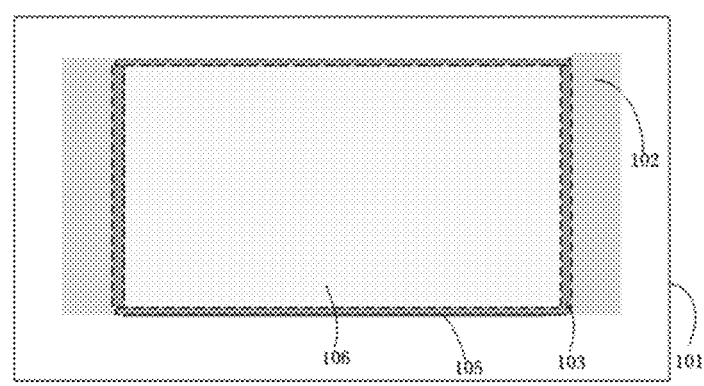
FIG. 7 is a plan view of a display screen according to the present invention.

The solution of the present embodiment is described in more detail below with reference to FIGS. 7-9. A display substrate of the present invention includes an active area 105 and a GOA circuit area 102. The active area 105 includes a display pixel area 106 and a dummy pixel area 103 located in the periphery of the display pixel area. The display pixel area 106 includes N rows*M columns of display pixels. There are a certain number of dummy pixels in the dummy pixel area 103. For example, there are 1*N dummy pixels on one side of the display pixel area 106.

The GOA circuit area includes a plurality of GOA circuits for driving the display pixels in the display pixel area. Each of the GOA circuits may drive one row of display pixels and the GOA circuits are accordingly arranged in N rows. An output terminal of each GOA circuit is connected to a reset terminal (Reset) of the GOA circuit in the previous row, and is also connected to an input terminal of the GOA circuit in the next row.

The GOA circuit area further includes at least one dummy GOA circuit for resetting the GOA circuit in the last row and the specific number of the dummy GOA circuits is determined by the number of clock signals (CLK).

Each GOA circuit may drive TFTs of one row of display pixels through a gate line 2a. The TFTs have a gate electrode connected to the gate line 2a, a drain electrode 5a connected to a data line, and a source electrode 5b connected to a pixel electrode 7. An active layer 4 of the TFTs is connected between the drain electrode 5a and the source electrode 5b. A common electrode 1 is arranged parallel to and spaced apart from the pixel electrode 7.

TFTs of the dummy pixels have a gate electrode connected to the gate line 2a, a drain electrode 5a connected to the data line, and a source electrode 5b not connected to the pixel electrode 7, so that the electrodes of the dummy pixels are floating and no signal is input thereto.

An output terminal of the dummy GOA circuit is connected to a pixel electrode 7 of at least one dummy pixel, so that loading of the dummy GOA circuit is the same as or approximate to loading of the GOA circuits. In an exemplary embodiment, the pixel electrode of the dummy pixel and a pixel electrode of its adjacent dummy pixel are connected through a connection line 8 to adjust a loading value of the dummy GOA circuit.

In an exemplary embodiment, pixel electrodes 7 of a plurality of dummy pixels connected to the output terminal of the dummy GOA circuit are connected in series and in parallel with one another to flexibly adjust the loading.

Since the pixel electrodes 7 of the dummy pixels have a fixed capacitance value and resistance value, the loading value may not be easily kept the same as or approximate to a target loading value when a plurality of pixel electrodes connected in series and in parallel are used. In an exemplary embodiment, the connection line 8 may be adjusted in size according to the need so as to be combined with the pixel electrode 7 to flexibly adjust the dummy loading.

In an exemplary embodiment, in another solution, a dummy loading area is located around the active area 105 and an electrode line is provided in the dummy loading area, leading to capacitance and resistance. The output terminal of the dummy GOA circuit is connected to the electrode line of the dummy loading area, and then connected to the pixel electrode 7 of the dummy pixel. With this solution, the dummy loading is adjusted more conveniently by taking the capacitance and resistance of the dummy loading area into consideration. It shall be noted that since the dummy loading area and the pixel electrode of the dummy pixel are combined to realize the dummy loading in this solution, and the dummy loading area plays a role of assistance, the dummy loading area here is much smaller than that in current technology, thus space around the active area may be efficiently used.

Figure 8:
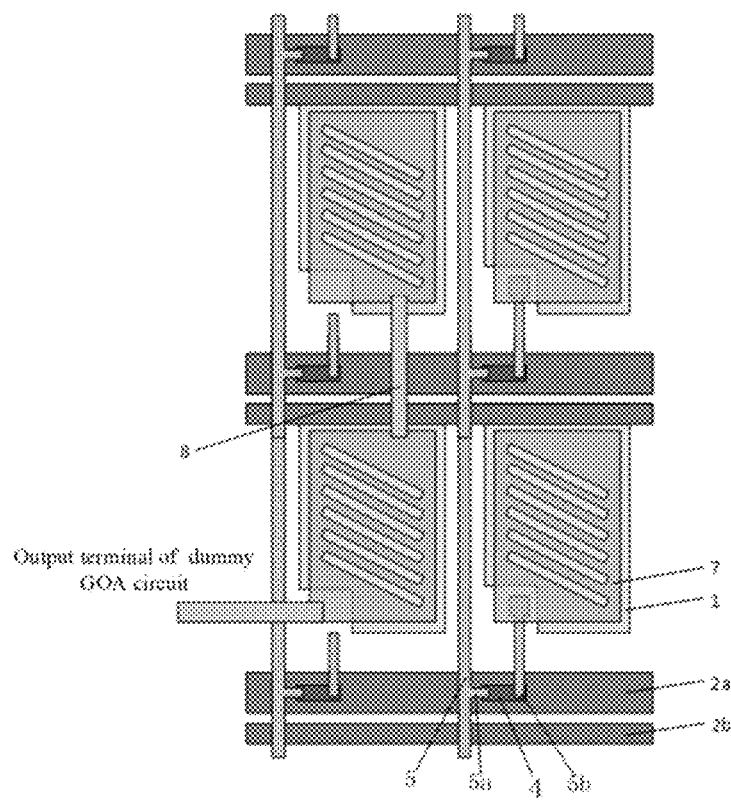
FIG. 8 is a plan view of pixels of a display substrate according to a first embodiment of the present invention.

FIG. 8 shows a specific solution of a display substrate according to the present invention. Pixels of the display substrate are Advanced Super Dimension Switch (ADS) structures. An active area 105 and a GOA circuit area 102 thereof are the same as those in the previous solution, which will not be elaborated here. The specific structure of an electrode will be focused on here with reference to the figure.

Each GOA circuit may drive TFTs of one row of display pixels through a gate line 2a. The TFTs have a gate electrode connected to the gate line 2a, a drain electrode 5a connected to a data line, and a source electrode 5b connected to a pixel electrode 7. An active layer 4 of the TFTs is connected between the drain electrode 5a and the source electrode 5b. A common electrode line and the gate line 2 are arranged in parallel. A Common electrode 1 is connected to the common electrode line, and is arranged below the pixel electrode 7 in a parallel arrangement.

The TFTs of the dummy pixels have a gate electrode connected to the gate line 2a, a drain electrode 5a connected to the data line, and a source electrode 5b not connected to the pixel electrode 7, so that the electrodes of the dummy pixels are floating and no signal is input thereto.

An output terminal of a dummy GOA circuit is connected to a pixel electrode 7 of one dummy pixel. The pixel electrode 7 and a pixel electrode 7 of an adjacent dummy pixel are connected through a connection line 8 to adjust a loading value of the dummy GOA circuit.

A method for manufacturing the electrode in the embodiment is described as follows:

A common electrode and a common electrode line are formed on a glass substrate 0, and afterwards a gate electrode and a gate line are formed on the glass substrate 0, and then a gate insulating layer 3 is coated thereon. Thereafter, an active layer is formed on the insulating layer 3, and afterwards an SD layer (a metal source/drain layer which includes a source electrode and a drain electrode) is provided, and then a passivation layer 6 (PVX) is formed thereon. Finally, a pixel electrode 7 is formed on the passivation layer 6. The pixel electrode of the dummy pixel and a pixel electrode of the display pixel have the same structure, except that the source electrode of the TFT of the dummy pixel is not connected to the pixel electrode 7. The connection line 8 and the pixel electrode 7 may be formed at the same time.

The pixel electrodes 7 of the dummy pixels are connected together through the connection line 8 and then, they are connected to the output terminal of the dummy GOA circuit. Therefore, a capacitance between the pixel electrode 7 of the dummy pixel and the common electrode becomes a capacitance at the output terminal of the dummy GOA circuit. The resistance of the pixel electrode 7 of the dummy pixel (its resistance is much larger than that of the gate line) is the resistance at the output terminal of the dummy GOA circuit, so it is designed as dummy loading of the dummy GOA circuit.

The specific number of the pixel electrodes 7 connected by the connection line 8 is determined according to parameters of the gate line 2 and the pixel electrode 7 at the design stage.

Figure 9:
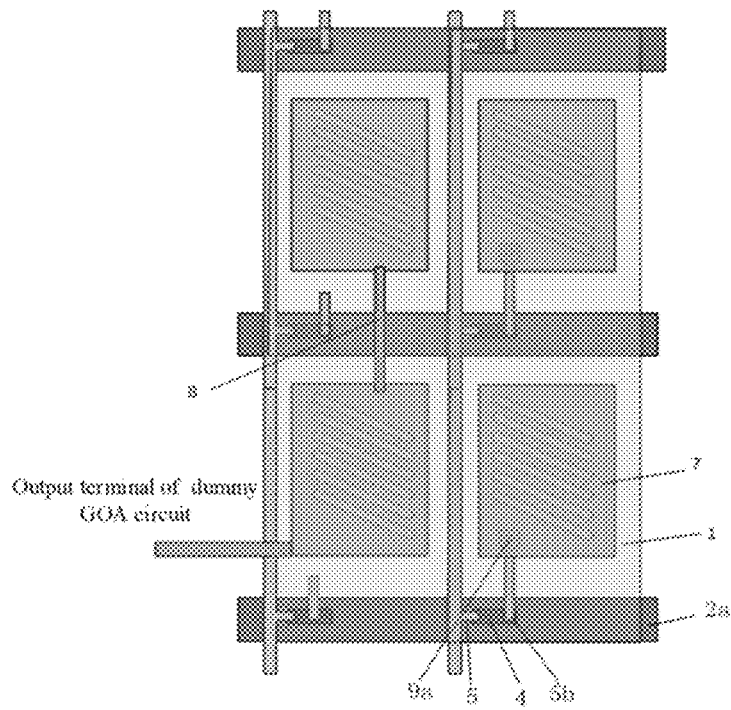
FIG. 9 is a plan view of pixels of a display substrate according to a second embodiment of the present invention.

FIG. 9 shows a specific solution of a display substrate according to the present invention. Pixels of the display substrate are Advanced Super Dimension Switch (HADS) structures. Each GOA circuit may drive TFTs of one row of display pixels through a gate line 2a. The TFTs have a gate electrode connected to the gate line 2a, a drain electrode 5a connected to a data line and a source electrode 5b connected to a pixel electrode 7. An active layer 4 of the TFTs is connected between the drain electrode 5a and the source electrode 5b. A common electrode 1 is connected to a common electrode line, and is arranged above the pixel electrode 7 in a parallel arrangement.

The TFTs of the dummy pixels have a gate electrode connected to the gate line 2a, a drain electrode 5a connected to the data line, and a source electrode 5b not connected to the pixel electrode 7, so that the electrodes of the dummy pixels are floating and no signal is input thereto.

An output terminal of a dummy GOA circuit is connected to a pixel electrode 7 of one dummy pixel. The pixel electrode 7 and a pixel electrode 7 of an adjacent dummy pixel are connected through a connection line 8 to adjust a loading value of the dummy GOA circuit.

A method for manufacturing the electrode in the embodiment is described as follows:

A gate layer (a gate electrode and a gate line) is formed on a glass substrate 0 and a gate insulating layer is formed on the gate layer. An active layer is formed on the gate insulating layer. Thereafter, a source-drain layer (a metal source/drain layer which includes a source electrode and a drain electrode) is provided and then, an organic film 9 is coated on the SD layer. Thereafter, a pixel electrode 7 and a connection line 8 are formed. Next, a passivation layer 6 (PVX) is formed thereon. Finally, a common electrode and a common electrode line are formed on the passivation layer 6. The pixel electrode of the dummy pixel and a pixel electrode of the display pixel have the same structure, except that the source electrode of the TFT of the dummy pixel is not connected to the pixel electrode 7. The connection line 8 and the pixel electrode 7 are formed at the same time. A via hole 9a is provided on the organic film 9 to connect the pixel electrode 7 and the source electrode 5b of the TFT.

The pixel electrodes 7 of the dummy electrodes are connected together through the connection line 8 and then, they are connected to the output terminal of the dummy GOA circuit. Therefore, the capacitance between the pixel electrode 7 of the dummy pixel and the com electrode becomes the capacitance at the output terminal of the dummy GOA circuit. The resistance of the pixel electrode 7 of the dummy pixel (its resistance is much larger than that of the gate line) is the resistance at the output terminal of the dummy GOA circuit, so it is designed as dummy loading of the dummy GOA circuit.

The specific number of the pixel electrodes 7 connected by the connection line 8 is determined according to parameters of the gate line 2 and the pixel electrode 7 at design stage.

The embodiments of the present disclosure are only example embodiments, and the explanations to the technical principles that are adopted. Those skilled in the art shall understand that the inventive scope of this application is not limited to the technical solution formed by incorporating the above technical features in a particular way, but also covers other technical solutions formed by incorporating the above technical features or their equivalent features without departing from the inventive concept. For example, a technical solution is formed by replacing the above features with technical features having similar functions disclosed in the present disclosure, but not limited thereto.

What is claimed is:

1. A display substrate, comprising:
    an active area; and
    a gate-driver-on-array (GOA) circuit area, wherein:
        the active area comprises a display pixel area and a dummy pixel area located in the periphery of the display pixel area; and
        the GOA circuit area comprises a plurality of GOA circuits and at least one dummy GOA circuit having an output terminal connected to a pixel electrode of at least one dummy pixel in the dummy pixel area.

2. The display substrate according to claim 1, wherein the pixel electrode of the at least one dummy pixel is a floating electrode.

3. The display substrate according to claim 2, wherein the display substrate further comprises:
    a dummy loading area located around the active area; and
    electrode lines that cause capacitance and resistance to be provided in the dummy loading area, wherein the electrode lines are connected between the output terminal of the dummy GOA circuit and the pixel electrode of the dummy pixel.

4. The display substrate according to claim 2, wherein a common electrode is disposed below the pixel electrode of the dummy pixel.

5. The display substrate according to claim 2, wherein:
    a common electrode is disposed above a pixel electrode of a display pixel in the display pixel area; and
    a source electrode of a thin film transistor (TFT) of the display pixel is connected to the pixel electrode of the display pixel through an organic film via hole provided on an organic film.

6. The display substrate according to claim 2, wherein a source electrode of a thin film transistor (TFT) of a display pixel is connected to a pixel electrode of the display pixel and a source electrode of a thin film transistor (TFT) of the dummy pixel is disconnected from the pixel electrode of the dummy pixel.

7. The display substrate according to claim 1, wherein, in an instance in which the output terminal of the dummy GOA circuit is connected to pixel electrodes of more than one dummy pixel, the pixel electrodes of adjacent dummy pixels are connected in series through a connection line.

8. The display substrate according to claim 1, wherein, in an instance in which the output terminal of the dummy GOA circuit is connected to pixel electrodes of more than one dummy pixel, the pixel electrodes of adjacent dummy pixels are connected in parallel through a connection line.

9. The display substrate according to claim 1, wherein the display substrate further comprises:
    a dummy loading area located around the active area; and
    electrode lines that cause capacitance and resistance to be provided in the dummy loading area, wherein the electrode lines are connected between the output terminal of the dummy GOA circuit and the pixel electrode of the dummy pixel.

10. The display substrate according to claim 1, wherein a common electrode is disposed below the pixel electrode of the dummy pixel.

11. The display substrate according to claim 1, wherein:
    a common electrode is disposed above a pixel electrode of a display pixel in the display pixel area; and
    a source electrode of a thin film transistor (TFT) of the display pixel is connected to the pixel electrode of the display pixel through an organic film via hole provided on an organic film.

12. The display substrate according to claim 1, wherein a source electrode of a thin film transistor (TFT) of a display pixel is connected to a pixel electrode of the display pixel and a source electrode of a thin film transistor (TFT) of the dummy pixel is disconnected from the pixel electrode of the dummy pixel.

13. A method for manufacturing a display substrate, comprising:
    providing the display substrate, the display substrate comprising:
        an active area; and
        a gate-driver-on-array (GOA) circuit area, wherein the active area comprises a display pixel area and a dummy pixel area located in the periphery of the display pixel area, and the GOA circuit area comprises a plurality of GOA circuits and at least one dummy GOA circuit having an output terminal connected to a pixel electrode of at least one dummy pixel;
    forming a common electrode and a common electrode line on a glass substrate;
    forming a gate electrode and a gate line on the substrate;
    coating a gate insulating layer thereon; forming an active layer on the insulating layer;
    providing a metal source/drain layer;
    forming a passivation layer on the metal source/drain layer; and
    forming the pixel electrode of at least one dummy pixel on the passivation layer.

14. The method for manufacturing the display substrate according to claim 13, further comprising:
    forming a plurality of pixel electrodes of dummy pixels and connection lines at the same time; and
    connecting pixel electrodes of adjacent dummy pixels through the connecting lines.

15. A method for manufacturing a display substrate, comprising:
    providing the display substrate, the display substrate comprising:
        an active area; and a gate-on-array (GOA) circuit area, wherein the active area comprises a display pixel area and a dummy pixel area located in the periphery of the display pixel area, and the GOA circuit area comprises a plurality of GOA circuits and at least one dummy GOA circuit having an output terminal connected to a pixel electrode of at least one dummy pixel;

forming a gate layer on a glass substrate;

forming a gate insulating layer on the gate layer;

forming an active layer on the gate insulating layer;

providing a metal source/drain layer;

coating an organic film on the metal source/drain layer to form an organic film layer;

forming a pixel electrode and a connection line;

forming a passivation layer on the pixel electrode and the connection line; and forming a common electrode and a common electrode line on the passivation layer.

16. The method for manufacturing the display substrate according to claim 15, further comprising forming an organic film via hole on the organic film layer before forming the pixel electrode and the connection line.

* * * * *